(12) United States Patent
Arata et al.

(10) Patent No.: US 6,180,250 B1
(45) Date of Patent: *Jan. 30, 2001

(54) EPOXY COMPOSITION FOR PRINTED CIRCUIT BOARDS

(75) Inventors: Michitoshi Arata; Shigeo Sase, both of Shimodate; Nozomu Takano, Yuki; Tomio Fukuda, Shimodate, all of (JP)

(73) Assignee: Hitachi Chemical Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/994,967

(22) Filed: Dec. 19, 1997

(30) Foreign Application Priority Data

Apr. 7, 1997 (JP) ...................................... 9-088016

(51) Int. Cl.⁷ ...................................... B32B 15/04
(52) U.S. Cl. ........................................... 428/457; 523/457
(58) Field of Search ............................. 523/453; 428/457

(56) References Cited

U.S. PATENT DOCUMENTS 4,510,276 * 4/1985 Leech et al. ........................ 523/427
5,661,223 * 8/1997 Oka et al. ........................... 525/481

FOREIGN PATENT DOCUMENTS 0 394 965 * 4/1990 (EP).
WO97/01591 * 1/1997 (WO).

OTHER PUBLICATIONS

Lee & Neville, Handbook of Epoxy Resins, pp. 10–13–10–14, Mar. 1967.*
Chemical Abstracts, vol. 115, No. 6, 12, Aug. 1991, Columbus Ohio, US; abstract no. 51448, XP002125690 & JP 03 043413 A (Hitachi Chemical Co., Ltd.) Feb. 25, 1991.*
Chemical Abstracts, vol. 126, No. 5, Feb. 3, 1997, Columbus Ohio, US; absract no. 60864, XP002125692 & JP 08 283382 A (Hitachi Chemical Co., Ltd.) Oct. 29, 1996.*
Patent Abstract of Japan, vol. 018, No. 097 (c–1167), Feb. 17, 1994 & Jp 05 295090 A (Hitachi Chemical Co., Ltd.), Nov. 9, 1993.*
Chemical Abstracts, vol. 122, No. 20, May 15, 1995, Columbus Ohio, US; abstract No. 241951, XP002125692 & JP 06 345883 A (Hitachi Chemical Co., Ltd.) Dec. 20, 1994.*
Database WPI Section Ch, Week 199146 Derwent Publications Ltd., London, GB; Class A21, AN 1991–335125, XP002125693 & JP 03 223268 A (Sumitomo Chem IND KK), Oct. 2, 1991.*
Database WPI Section Ch, Week 199712 Derwent Publications Ltd., London, GB; Class A21, AN 1997–128803, XP002125694 & JP 09 012677 A (Hitachi Chem CO LTD), Jan. 14, 1997.*

* cited by examiner

Primary Examiner—Robert Dawson
Assistant Examiner—D. Aylward
(74) Attorney, Agent, or Firm—Dickstein Shapiro Morin & Oshinsky LLP

(57) ABSTRACT

To provide an epoxy resin composition for printed circuit boards which demonstrates little tendency to absorb moisture, high heat-resistance, favorable high temperature properties, resistance to metal migration, favorable anti-fade property at high temperatures, high Tg, high electric insulating performance and resistance against peeling of the copper foil when formed into a printed circuit board, there is provided epoxy resin composition for printed circuit boards, comprising: (a) epoxy resin obtained by glycidyl etherifying a condensation product of a phenol and hydroxybenzaldehyde; (b) a condensation product of bisphenol A and formaldehyde; (c) a flame retardant; (d) a curing agent; (e) one or both of a phenol antioxidant and an organic sulfur compound antioxidant; and (f) a urea derivative. This composition is highly suitable as a material for manufacturing epoxy resin prepreg in general and printed circuit boards.

8 Claims, No Drawings

EPOXY COMPOSITION FOR PRINTED CIRCUIT BOARDS

TECHNICAL FIELD

The present invention relates to an epoxy resin composition for printed circuit boards, and prepreg and a metal laminated board using the same.

BACKGROUND OF THE INVENTION

With the progress in compact design and performance improvement in the field of electronic equipment production, an increasingly high density design has come to be required in the design of printed circuit boards used in the electronic equipment as exemplified in the increase in the number of layers of the printed circuit board, the reduction in the thickness of the board, and the reduction in the diameters and the spacing of the through holes. According to a more recent proposal, semiconductor chips are directly mounted on a printed circuit board, and the entire assembly is sealed in a resin package. Semiconductor packages such as plastic pin grid arrays and plastic ball grid arrays often consist of printed circuit boards. A printed circuit, when applied to a semiconductor package, may be subjected to temperatures exceeding 175° C. for wire bonding and resin sealing during the manufacturing process. In such a case, if the mechanical strength or the resiliency of the printed circuit board is insufficient, it could lead to various problems such as poor connection of the bonding wire, and warping and twisting of the circuit board following the sealing process. To achieve favorable material properties such as hardness and resiliency at high temperatures in excess 175° C., Tg (the glass transition temperature) must be raised to a level which has not been hitherto possible. Also, because the printed circuit board for a semiconductor package requires an extremely high density wiring pattern, the reliability in ensuring electric insulation is important for the material of the printed circuit board.

To meet such requirements, there have been proposals to raise Tg (the glass transition temperature) of epoxy resin for printed circuit boards. For instance, it was proposed to cure multi-functional epoxy resin by using dicyandiamide in Japanese patent laid open publication (kokai) No. 60-155453). However, the epoxy resin which is cured by using dicyandiamide tends to absorb moisture, and is therefore known to be inadequate for ensuring the level of electric insulation capability which can meet the demand for insulating printed circuit boards of high density design. In particular, migration of the material of the metal, which forms wiring, circuit patterns and terminals in or on the printed circuit board, on or inside the insulating material under the influence of high temperatures and voltage differences poses a serious problem.

On the other hand, the printed circuit board obtained by curing epoxy resin by using multi-functional phenol resin has a significantly loss tendency to absorb moisture, and therefore demonstrates a better ability to avoid metal migration. However, a printed circuit board made by using multi-functional phenol may fade in color during the heating process depending on the kind of the phenol used. In Japanese patent publication (kokoku) No. 62-28168, it was proposed to use material mainly consisting of phenol or bisphenol A mixed with high orthophenol-formaldehyde resin to avoid the fading of the printed circuit board, but Tg which allows the printed circuit board to withstand temperatures in excess of 175° C. cannot be attained.

Also, when multi-functional epoxy resin is cured by multi-functional phenol, Tg may be raised to a sufficient level, but the cured resin becomes so rigid and inflexible that the adhesion to the metallic foil may become poor, and small cracks may be produced when through holes are drilled in the printed circuit board. Such small cracks are known to cause metal migration, and are highly detrimental to the reliable insulation of the printed circuit board.

BRIEF SUMMARY OF THE INVENTION

In view of such problems of the prior art, a primary object of the present invention is to provide an epoxy resin composition for printed circuit boards which demonstrates little tendency to absorb moisture, high heat-resistance, favorable high temperature properties, resistance to metal migration, favorable anti-fade property at high temperatures, high Tg, high electric insulating performance and resistance against peeling of the copper foil when formed into a printed circuit board.

A second object of the present invention is to provide prepreg having favorable properties by being formed from such a composition.

A third object of the present invention is to provide a metal laminated board suitable for use as a printed circuit board which has favorable properties by being formed from such a composition.

According to the present invention, such an object can be accomplished by providing an epoxy resin composition for printed circuit boards, comprising: (a) epoxy resin obtained by glycidyl etherifying a condensation product of a phenol and hydroxybenzaldehyde; (b) a condensation product of bisphenol A and formaldehyde; (c) a flame retardant; (d) a curing agent; (e) one or both of a phenol antioxidant and an organic sulfur compound antioxidant; and (f) a urea derivative.

The present invention further provides epoxy resin prepreg for printed circuit boards obtained by impregnating a base member with a varnish of the above mentioned epoxy resin composition for printed circuit boards, and a metal laminated board obtained by laminating metal foil with the above mentioned epoxy resin prepreg.

The epoxy resin of (a) may be prepared by using a condensation product of monohydric phenol having such alkyl groups as propyl group and tert-butyl group, such as phenol and creosol, and hydroxybenzaldehyde such as salicylaldehyde, m-hydroxybenzaldehyde, p-hydroxybenzaldehyde, vanillin, syringaldehyde, β-resorcylaldehyde, and protocatechualdehyde in the presence of catalytic acid, as a base material, and glycidyl etherifying it by using epichlorohydrin or the like. However, the kinds of phenol and hydroxybenzaldehyde are not limited to those listed above, and the methods of condensation and glycidyl etherification in no way limit the present invention. According to the present invention, epoxy resins other than those listed in (a) may be used in combination. Such epoxy resins may include bisphenol A type epoxy resin, bisphenol F type epoxy resin, bisphenol S type epoxy resin, biphenol type epoxy resin, phenol novolac type epoxy resin, creosol novolac type epoxy resin, bisphenol A novolac type epoxy resin, bisphenol F novolac type epoxy resin, alicyclic epoxy resin, aliphatic chain epoxy resin, glycidyl ester type epoxy resin, glycidyl amine type epoxy resin, hydantoin type epoxy resin, and isocyanurate type epoxy resin. Also, glycidyl compounds of bifunctional phenols, glycidyl esters of bifunctional alcohols, hydrogen added products of these compounds, and halides of these compounds may be used. These compounds can be freely used without any reservation, and any number of them can be used in combination.

The molecular weight of the condensation product of bisphenol A type epoxy resin and formaldehyde of (b) may be freely selected, and the product may contain bisphenol A monomer. It is also possible to use curing agents other than the condensation product of bisphenol A type epoxy resin and formaldehyde in combination. Such curing agents may include phenols such as bisphenol F, polyvinylphenol or phenol, creosol, alkylphenol, catecohl, and novolac resins such as bisphenol F. The molecular weights of these compounds can also be freely selected, and any number of them may be used in combination. The equivalent ratio of the phenol hydroxyl group to the epoxy group should be preferably in the range of 0.5 to 1.5. If the equivalent ratio is less than 0.5, the epoxy group would be in excess. If the equivalent ratio is more than 1.5, the phenol hydroxyl group would be in excess. Curing of the resin would be inadequate in either case. More preferably, the equivalent ratio should be in the range of 0.8 to 1.2.

The flame retardant of (c) can be selected from any compounds that are known as flame retardant, and may consist of bisphenol A type epoxy resin, bisphenol F type epoxy resin, bisphenol S type epoxy resin, phenol novolac type epoxy resin, creosol novolac type epoxy resin, bisphenol A novolac type epoxy resin, bisphenol F novolac type epoxy resin, alicyclic epoxy resin, aliphatic chain epoxy resin, glycidyl ester type epoxy resin, glycidyl amine type epoxy resin, hydantoin type epoxy resin, and isocyanurate type epoxy resin. The flame retardant may also consist of halide flame retardants such as halides of glycidyl etherified bifunctional alcohol, halides of novolac resins such as bisphenol A, bisphenol F, polyvinylphenol or phenol, creosol, alkylphenol, catecohl, and novolac resins such as bisphenol F. Additionally, the flame retardant may be freely selected from such inorganic flame retardants such as antimony trioxide, red phosphorus, zirconium hydroxide, barium metaborate, aluminum hydroxide, and magnesium hydroxide, and phosphor flame retardants such as tetraphenyl phosphine, tricresyl-diphenyl phosphate, triethylphosphatc, cresyldiphenylphosphate, xylenyl-diphenyl phosphate, acid phosphate esters, phosphate compounds containing nitrogen, and phosphate esters containing halides.

The curing agent of (d) may consist of any compound having the catalytic function to promote the ester reaction between the epoxy group and the phenol hydroxide group, and such a compound may be selected from alkalinc metal compounds, alline earth metal compounds, imidazole compounds, organic phosphor compounds, secondary amine compounds, tertiary amine compounds, and quaternary ammonium salts.

The imidazole compounds may include imidazole, 2-ethylimidazole, 2-ethyl-4-imidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, and 2-phenyl-4-methylimidazoline. Any number of such curing agents may be used in combination. The amount of the curing agent that is to be added to 100 weight parts of epoxy resin should be in the range of 0.01 to 5 weight parts. If the added amount of the curing agent is less than 0.01 weight parts, the curing action will be insufficient. If the added amount of the curing agent is more than 5 weight parts, the long-term stability of the material will be lost.

The antioxidant of (e) may consist of at least one of phenol antioxidants and organic sulfur compound antioxidants. The phenol antioxidants can improve electric insulation without impairing other properties such as suitability for drilling. The phenol antioxidants may include monophenols such as 1,2,3-trihydroxybenzene, 2,6-di-t-butyl-p-creosol, butylated hydroxyanisole, and 2,6-di-t-butyl-4-ethylphenol, bisphenols such as 2,2'-methylene-bis-(4-methyl-6-t-butylphenol), 4,4'-thiobis-(3-methyl-6-t-butylphenol), 2,2-methylenebis(4-ethyl-6-t-butylphenol), 4,4'-butylidenebis (3-methyl-6-t-butylphenol), 3,9-bis[1,1-dimethyl-2-[β-(3-t-butyl-4-hydroxy-5-methylphenyl)propionyloxy]ethyl, and 2,4,8,10-tetraoxaspiro[5,5]undecan, and high polymer phenols such as 1,1,3-tris(2-methyl-4-hydroxy-5-t-butylphenyl) butane, 1,3,5-trimethyl-2,4,6-tris(3,5-di-t-butyl-4-hydroxybenzil)benzene, tetrakis-(methylene-3-(3',5'-di-t-butyl-4'-hydroxyphenyl)propionate )methane, bis(3,3-bis-(4'-hydroxy-3'-t-butylphenyl) butylic acid)glycohl ester, 1,3,5-tris(3',5'-di-t-butyl-4'-hydroxybenzil)-s-triazene-2,4,6-(1H,3H,5H) trion. In particular, hindered phenol antioxidants are preferred as phenol antioxidants, and are preferably selected from a group consisting of butylated hydroxyanisole, and 2,6-di-t-butyl-4-ethylphenol, 2,2'-methylene-bis-(4-methyl-6-t-butylphenol), 4,4'-thiobis-(3-methyl-6-t-butylphenol), 4,4'-butylidenebis(3-methyl-6-t-butylphenol), 1,1,3-tris(2-methyl 4-hydroxy-5-t-butylphenyl)butane, 1,3,5-trimethyl-2,4,6-tris(3,5-di-t-butyl-4-hydroxybenzil)benzene, and tetrakis-(methylene-3-(3',5'-di-t-butyl-4'-hydroxyphenyl)propionate)methane.

The organic sulfur antioxidants may consist of dilauryl-thiodipropionate, distearyl-thiodipropionate, and dimyrstyl-thiodipropionate. In particular, of these organic sulfur antioxidants, dilauryl-thiodipropionate and distearyl-thiodipropionate are preferred.

These antioxidants may also be used in combination, and the content of the oxidant should be in the range of 0.1 to 20 weight parts for 100 weight parts of epoxy resin. If the content is less than 0.1 weight parts, electric insulation will not be improved. If the content exceeds 20 weight parts, electric insulation will even be impaired.

The urea derivative of (e) should have the molecular structure indicated in Chemical Formula (1).

(Chemical Formula 1)

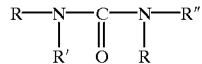

where R, R', and R" represent hydrogen, alkyl group, substituent containing alkane, substituent containing alkene, cyano group, nitro group, substituent containing an aromatic ring such as phenyl group, and substituent containing a heterocycle such as imidazole.

The urea derivative may be selected from a group consisting of urea, N-monoalkyl urea, N,N-dialkyl urea, N,N'-dialkyl urea, N-alyl urea, diacetyl urea, dibenzoil urea, benzenesulfonyl urea, P-toluensulfonyl urea, trialkyl urea, tetraalkyl urea, phenyl urea, diphenyl urea, N-P-ethoxyphenyl-N'-vinyl urea, nitroso urea, biurea, biuret, guanyl urea, hydantoin, γ-carbamylpropyl-triethoxysilane and other chain and cyclic compounds such as ureido compounds, isourea compounds and semicarbazide compounds. These urea compounds may also be used in combination. The content of the urea compound should be in the range of 0.1 to 10 weight parts for 100 weight parts of epoxy resin. If the content is less than 0.1 weight parts, the bonding force against the peeling of the copper foil may not be adequate. If the content is more than 10 weight parts, the heat resistance may not be adequate so that the material may not be suitable for drilling.

The epoxy resin composition for printed circuit boards according to the present invention may be used in a wide range of forms, but is typically dissolved in solvents for coating the composition over the base member or impregnating the base member with the composition. Such solvents may be selected from acetone, methylethylketone, toluen, xylene, methylisobutylketone, ethyl acetate, ethyleneglycol-monomethylether, N,N-dimethylacetamide, methanol, and ethanol. These may also be used in combination.

The epoxy resin composition for printed circuit boards according to the present invention may be mixed with inorganic fillers such as powder consisting of crystalline silica, molten silica, alumina, zircon, calcium silicate, calcium carbonate, silicon carbide, silicon nitride, boron nitride, beryllia, magnesia, zirconia, forsterite, steatite, spinel, mulite, and titania, mono-crystalline fibers consisting of potassium titanate, silicon carbide and alumina, and glass fibers, and any number of these materials may be used in combination.

The varnish which is obtained from the composition consisting of (a) to (f) is impregnated in a base member such as glass fabric, glass unwoven fabric, paper, and fabric made of materials other than glass, and the assembly is dried in an oven at a temperature in the range of 80 to 200° C. to obtain epoxy resin prepreg for printed circuit boards according to the present invention. The prepreg is them laminated with metallic foil, and is formed into metal laminated board by heating and pressing for 30 to 180 minutes under the condition of 150 to 190° C., and 20 to 80 kgf/cm². A multi layer printed circuit board can then be made by laminating an inner laminated board and an outer laminated board by placing a layer of prepreg so between them The drying process consists of removing the solvent when such solvent is used, or removing the fluidity from the material when no solvent is used. The final result consists of the so-called B-stage.

According to the present invention, by using an epoxy resin composition for printed circuit boards, comprising: (a) epoxy resin obtained by glycidyl etherifying a condensation product of a phenol and hydroxybenzaldehyde; (b) a condensation product of bisphenol A and formaldehyde; (c) a flame retardant; (d) a curing agent; (e) one or both of a phenol antioxidant and an organic sulfur compound antioxidant; and (f) a urea derivative, there is provided an epoxy resin composition for printed circuit boards which demonstrates little tendency to absorb moisture, high heat-resistance, favorable high temperature properties, resistance to metal migration, favorable anti-fade property at high temperatures, high Tg, high electric insulating performance and resistance against peeling of the copper foil when formed into a printed circuit board.

DETAILED DESCRIPTION OF THE PREFERRED EMBODIMENTS

Now the present invention is described in the following in terms of concrete embodiments, but these embodiments are not intended to limit the present invention.

[Embodiment #1]

100 weight parts of phenol salicylaldehyde novolac type epoxy resin (epoxy equivalent 170), selected as (a) epoxy resin obtained by glycidyl etherifying a condensation product of a phenol and hydroxybenzaldehyde, 48 weight parts of bisphenol A novolac resin (hydroxyl equivalent 114), selected as (b) a condensation product of bisphenol A and formaldehyde, and 52 weight parts of tetrabromobisphenol A (bromide content 58 weight %, and hydroxyl equivalent 272), selected as (c) a flame retardant, were dissolved in methylethylketone. 0.3 weight parts of 1-cyanoethyl-2-ethyl-4-methylimidazole selected as (e) a phenol antioxidant and 2 weight parts of urea selected as (f) a urea derivative were mixed with the composition to obtain a varnish of a composition for printed circuit boards containing 65% of nonvolatile components.

[Embodiment #2]

The varnish of the epoxy composition for printed circuit board was prepared in the same way as Embodiment #1 except for that 0.3 weight parts of γ-carbamylpropyl-triethoxysilane was used instead of the urea of Embodiment #1.

[Embodiment #3]

The varnish of the epoxy composition for printed circuit board was prepared in the same way as Embodiment #1 except for that 0.5 weight parts of pyrogallol was used instead of the 4,4-butylidenebis(3-methyl-6-t-butylphenol) of Embodiment #1.

[Embodiment #4]

The varnish of the epoxy composition for printed circuit board was prepared in the same way as Embodiment #1 except for that 0.5 weight parts of dilaurylthiodipropionate selected as an organic sulfur compound oxidant was used instead of the 4,4-butylidenebis(3-methyl-6-t-butylphenol) of Embodiment #1.

[Embodiment #5]

The varnish of the epoxy composition for printed circuit board was prepared in the same way as Embodiment #1 except for that a combination of 0.25 weight parts of dilaurylthiodipropionate and 0.25 weight parts of 4,4-butylidenebis-(3-methyl-6-t-butylphenol) was used instead of the 4,4-butylidenebis-(3-methyl-6-t-butylphenol) of Embodiment #1.

COMPARATIVE EXAMPLE #1

The varnish of the epoxy composition for printed circuit board was prepared in the same way as Embodiment #1 except for that the 4,4-butylidenebis-(3-methyl-6-t-butylphenol) of Embodiment #1 was omitted.

COMPARATIVE EXAMPLE #2

The varnish of the epoxy composition for printed circuit board was prepared in the same way as Embodiment #1 except for that the urea of Embodiment #1 was omitted.

COMPARATIVE EXAMPLE #3

The varnish of the epoxy composition for printed circuit board was prepared in the same way as Comparative Example #1 except for that the urea of Comparative Example #1 was omitted.

COMPARATIVE EXAMPLE #4

The varnish of the epoxy composition for printed circuit board was prepared in the same way as Comparative Example #3 except for that a combination of 100 weight parts of o-creosol novolac epoxy resin (epoxy equivalent 195), 38 weight parts of bisphenol A novolac epoxy resin, and 48 weight parts of tetrabromobisphenol A was used instead of the phenol salicylaldehyde novolac epoxy resin of Comparative Example #3.

COMPARATIVE EXAMPLE #5

The varnish of the epoxy composition for printed circuit board was prepared in the same way as Comparative Example #3 except for that a combination of 43 weight parts of phenol novolac epoxy resin (hydroxy equivalent 106) and 50 weight parts of tetrabromobisphenol A was used in stead of the combination of 48 weight parts of bisphenol A novolac epoxy resin and 52 weight parts of tetrabromobisphenol A of Comparative Example #3.

COMPARATIVE EXAMPLE #6

To 80 weight parts of bisphenol A low brominated epoxy resin (bromide content 21 weight %, epoxy equivalent 485) and 20 weight parts of o-creosol novolac epoxy resin is added one weight part of dicyandiamide which was dissolved in ethyleneglycol-monomethylether in advance. 0.2 weight parts of 1-cyanoethyl-2-ethyl-4-methylimidazole was added thereto as a curing agen;, and a methylketone varnish having a nonvolatile content of 65 weight % was obtained therefrom. The varnishes of the epoxy resin for printed circuit boards which were described above were obtained as summarized in the following Tables 1 and 2.

TABLE 1

| Embodiments | #1 | #2 | #3 | #4 | #5 |
|---|---|---|---|---|---|
| phenol salicylaldeliyde novolac epoxy resin | 100 | 100 | 100 | 100 | 100 |
| o-creosol novolac epoxy resin | — | — | — | — | — |
| low brominated epoxy resin | — | — | — | — | — |
| bisphenol A novolac epoxy resin | 48 | 48 | 48 | 48 | 48 |
| phenol novolac epoxy resin | — | — | — | — | — |
| tetrabromobisphenol A | 52 | 52 | 52 | 52 | 52 |
| 1-cyanoethyl-2-ethyl-4-methylimidazole | 0.3 | 0.3 | 0.3 | 0.3 | 0.3 |
| dicyandiamide | — | — | — | — | — |
| 4,4-butylidenebis(3-methyl-6-t-butylphenol) | 0.5 | 0.5 | — | — | 0.25 |
| pyrogallol | — | — | 0.5 | — | — |
| dilaurylthiodipropionate | — | — | — | 0.5 | 0.25 |
| urea | 2.0 | — | 2.0 | 2.0 | 2.0 |
| γ-carbamylpropyl-methoxysilane | — | 0.3 | — | — | - |

TABLE 2

| Comparative Examples | #1 | #2 | #3 | #4 | #5 | #6 |
|---|---|---|---|---|---|---|
| phenol salicylaldehyde novolac epoxy resin | 100 | 100 | 100 | — | 100 | — |
| o-creosol novolac epoxy resin | — | — | — | 100 | — | 20 |
| low brominated epoxy resin | — | — | — | — | — | 80 |
| bisphenol A novolac epoxy resin | 48 | 48 | 48 | 38 | — | — |
| phenol novolac epoxy resin | — | — | — | — | 43 | — |
| tetrabromobisphenol A | 52 | 52 | 52 | 48 | 50 | — |
| 1-cyanoethyl-2-ethyl-4-methylimidazole | 0.3 | 0.3 | 0.3 | 0.3 | 0.3 | 0.2 |
| dicyandiamide | — | — | — | — | — | .0 |
| 4,4-butylidenebis(3-methyl-6-t-butylphenol) | — | 0.5 | — | — | — | — |
| pyrogallol | — | — | — | — | — | — |
| dilaurylthiodipropionate | — | — | — | — | — | — |
| urea | 2.0 | — | — | — | — | — |
| γ-carbamylpropyl-triethoxysilane | — | — | — | — | — | — |

The varnishes obtained from Embodiments #1 to #5 and Comparative Examples #1 to #6 were used for impregnating glass fabric (having the weight of 210 g/m$^2$) having the thickness of 0.2 mm, and this assembly was heated at 160° C. for two to five minutes to obtain epoxy resin prepreg for printed circuit boards. The long-term stability of the obtained epoxy resin prepreg for printed circuit boards was evaluated by measuring the gel time of the sample immediately after it is produced, and after it has been stored for 60 days at 25° C. and 50% RH. A two sided metal laminated board was obtained by combining four layers of the obtained prepreg and copper foil having the thickness of 18 μm placed on each side of the assembly, and pressing it under the condition of 175° C., 90 minutes and 2.5 MPa. The glass transformation temperature (Tg), heat-resistance for soldering, resistance to metal migration, fading property at high temperatures, and bending strength and bending elasticity at both room temperature and 200° C. were measured. The results are summarized in Tables 3 and 4.

The test methods are summarized in the following.

Tg: The copper foil was etched away, and TMA (thermo-mechanical analysis was used for measurement (° C.).

Soldering heat resistance: The copper foil was etched away, and after the sample was placed in a pressure cooker tester (121° C., 0.22 MPa) for two hours, the sample was dipped into a solder bath at 260° C. for 20 seconds. The external appearance of the sample was visually inspected, and NG in Tables indicates the occurrence of measling or bloating.

Moisture absorption ratio: The copper foil was etched away, and after the sample was placed in a pressure cooker tester (121° C., 0.22 MPa) for four hours, the difference in weight before and after the test was measured (weight %).

Heat fading property: The copper foil was etched away, and after the sample was placed under an atmospheric condition at 160° C. for five hours, the external appearance of the sample was visually inspected. ○ indicates that there was no fading, Δ indicates that there was a slight fading, and X indicates that there was a fading.

Insulation test: A test pattern having through holes at the spacing of 350 μm was used, and the insulation property for 400 holes was measured over a prescribed time period for each of the samples. The test conditions include 85° C., 90% RH, and 100 volts, and the time period was measured until the insulation break down.

Strength against peeling of copper foil: The test was conducted according to JIS C6481 at room temperature (kN/m).

Bending test. The test was conducted according to JIS C6486 at room temperature and 200° C. [bending strength (GPa) and bending elasticity (MPa)].

TABLE 3

| Embodiments | #1 | #2 | #3 | #4 | #5 |
|---|---|---|---|---|---|
| Tg | 205 | 205 | 205 | 205 | 205 |
| soldering heat resistance | OK | OK | OK | OK | OK |
| moisture absorption ratio | 0.56 | 0.55 | 0.56 | 0.59 | 0.55 |
| days before insulation broke | >300 | >300 | >300 | >300 | >300 |
| heat fading property | ○ | ○ | ○ | ○ | ○ |
| strength against peeling of copper foil | 1.42 | 1.44 | 1.41 | 1.40 | 1.41 |
| bending strength | | | | | |
| room temperature | 622 | 634 | 630 | 611 | 624 |
| 200° C. | 82 | 84 | 81 | 86 | 83 |
| bending elasticity | | | | | |
| room temperature | 23.5 | 22.8 | 23.0 | 22.8 | 23.1 |
| 200° C. | 13.5 | 13.0 | 13.2 | 13.3 | 13.4 |

TABLE 4

| Comparative Examples | #1 | #2 | #3 | #4 | #5 | #6 |
|---|---|---|---|---|---|---|
| Tg | 205 | 204 | 204 | 180 | 176 | 122 |
| soldering heat resistance | OK | OK | OK | OK | OK | NG |
| moisture absorption ratio | 0.55 | 0.54 | 0.54 | 0.44 | 0.51 | 1.05 |
| days before insulation broke | 260 | >300 | 260 | 280 | 250 | 55 |
| heat fading property | ◯ | ◯ | ◯ | ◯ | Δ | Δ |
| strength against peeling of copper foil | 1.42 | 1.00 | 0.99 | 1.07 | 1.12 | 1.6 |
| bending strength | | | | | | |
| room temperature | 17 | 620 | 620 | 624 | 631 | 642 |
| 200° C. | 81 | 83 | 83 | 51 | 53 | 25 |
| bending elasticity | | | | | | |
| room temperature | 22.8 | 22.5 | 22.5 | 23.1 | 22.7 | 23.5 |
| 200° C. | 12.4 | 12.7 | 12.7 | 10.4 | 10.2 | 9.5 |

The following conclusions can be drawn from the above results.

Embodiments #1 to #5 which used phenol salicylaldehyde novolac type epoxy for the epoxy resin in combination with an antioxidant and a urea compound demonstrated higher Tg exceeding 200° C., favorable solder heat resistance, favorable insulating properties, and a strength against peeing exceeding 1.4 kN/m. Also, the reduction in bending strength and bending elasticity from the room temperature to 200° C. was small. Embodiments #1 to #5 and Comparative Examples #1 to #4 which used bisphenol A novolac epoxy resin showed very little fading at high temperatures.

On the other hand, Comparative Examples #1 and #3 to #6 which did not contain any antioxidant showed a poor insulating property, and Comparative Examples #2 to #5 which did not contain any urea derivative showed a low strength against peeling of copper foil. Comparative Example #4 which used o-creosol novolac epoxy resin for the epoxy resin and Comparative Example #5 which used phenol novolac resin instead of bisphenol novolac resin showed a relatively low Tg, and poor bending strength and bending elasticity at 200° C. Comparative Example #5 which used phenol novolac for the curing agent showed a poor fading property when heated, and Comparative Example #6 which used dicyandiamide showed a low Tg, poor bending strength and bending elasticity at 200° C., high moisture absorption ratio and poor insulation property.

When the epoxy resin composition for printed circuit boards according to the present invention is used for preparing prepreg, laminated boards, and printed circuit boards, it is possible to achieve a low tendency to absorb moisture, favorable fading property when heated, high Tg, freedom from metal migration, high electric insulation, and high strength against peeling of copper foil.

Although the present invention has been described in terms of preferred embodiments thereof, it is obvious to a person skilled in the art that various alterations and modifications are possible without departing from the scope of the present invention which is set forth in the appended claims.

What we claim is:

1. An epoxy resin composition for printed circuit boards having resistance against peeling of metal foil, comprising:
   (a) epoxy resin obtained by glycidyl etherifying a condensation product of a phenol and hydroxybenzaldehyde;
   (b) a condensation product of bisphenol A and formaldehyde; and
   (c) a urea derivative.

2. An epoxy resin composition for printed circuit boards according to claim 1, further comprising a flame retardant, a curing agent and one or both of a phenol antioxidant and an organic sulfur compound antioxidant.

3. An epoxy resin composition for printed circuit boards according to claim 1, wherein the phenol antioxidant consists of a hindered phenol antioxidant.

4. An epoxy resin composition for printed circuit boards according to claim 1, wherein the phenol antioxidant consists of a hindered phenol antioxidant selected from a group consisting of butylated hydroxyanisole, 2,6-di-t-butyl-4-ethylphenol, 2,2'-methylene-bis(4-methyl-6-t-butylphenol), 4,4'-thiobis-(3-methyl-6-t-butylphenol), 4,4'-butylidene-bis(3-methyl-6-t-butylphenol), 1,1,3-tris(2-methyl-4-hyrdoxy-5-t-butylphenyl)butane, 1,3,5-trimethyl-2,4,6-tris(3,5-di-t-butyl-4-hydroxybenzyl)benzene, and tetrakis-[methylene-3-(3',5'-di-t-butyl)-4'-hydroxyphenylpropionate]methane.

5. An epoxy resin composition for printed circuit boards according to claim 1, wherein the organic sulfur compound antioxidant consists of dilauryl thiodipropionate or distearyl thiodipropionate.

6. Epoxy resin prepreg for printed circuit boards obtained by impregnating a base member with a varnish of epoxy resin composition for printed circuit boards according to any one of claims 2–4, and 5, and drying the assembly.

7. A metal laminated board obtained by laminating metal foil with epoxy resin prepreg according to claim 6, and heating and pressing the assembly.

8. An epoxy resin composition for printed circuit boards according to claim 1, wherein said metal is copper.

* * * * *